US00RE35845E

United States Patent [19]

Butera

[11] E Patent Number: Re. 35,845

[45] Reissued Date of Patent: Jul. 14, 1998

[54] RF TRANSISTOR PACKAGE AND MOUNTING PAD

[75] Inventor: Gasper Butera, Blue Bell, Pa.

[73] Assignee: SGS-Thomson Microelectronics, Inc., Carrollton, Tex.

[21] Appl. No.: 235,022

[22] Filed: Apr. 28, 1994

Related U.S. Patent Documents

Reissue of:

[64] Patent No.: 5,109,268
Issued: Apr. 28, 1992
Appl. No.: 458,585
Filed: Dec. 29, 1989

[51] Int. Cl.[6] ..... H01L 39/02

[52] U.S. Cl. ..... 257/702; 257/701; 257/707; 257/77

[58] Field of Search ..... 257/77, 701, 702, 257/707

[56] References Cited

U.S. PATENT DOCUMENTS

| | | | |
|---|---|---|---|
| 3,364,400 | 1/1968 | Granberry | 317/235 |
| 3,489,956 | 1/1970 | Yanai et al. | 357/62 |
| 3,500,066 | 3/1970 | Pritchett | 357/69 |
| 3,626,259 | 12/1971 | Torrance et al. | 357/14 |
| 3,651,434 | 3/1972 | McGeough et al. | 333/84 |
| 3,753,056 | 8/1973 | Cooke | 317/234 |
| 3,801,882 | 4/1974 | Ward | 357/70 |
| 3,908,185 | 9/1975 | Martin | 357/71 |
| 3,936,864 | 2/1976 | Benjamin | 357/14 |
| 3,996,603 | 12/1976 | Smith | 357/80 |
| 3,999,142 | 12/1976 | Presser et al. | 357/40 |
| 4,161,740 | 7/1979 | Frey | 357/36 |
| 4,168,507 | 9/1979 | Yester | 357/51 |
| 4,556,899 | 12/1985 | Kurihara | 357/80 |
| 4,561,010 | 12/1985 | Ogihara | 357/74 |
| 4,639,760 | 1/1987 | Granberg et al. | 357/68 |
| 4,649,416 | 3/1987 | Borkowski et al. | 357/74 |
| 4,907,067 | 3/1990 | Derryberry | 357/80 |

FOREIGN PATENT DOCUMENTS

| | | |
|---|---|---|
| 0297569 | 1/1989 | European Pat. Off. . |
| 3336867 | 4/1985 | Germany . |
| 2084796 | 4/1982 | United Kingdom . |

OTHER PUBLICATIONS

Patent Abstracts of Japan, vol. 11 No. 198 (E-519)(2645) Jun. 25, 1987 & JP-A-62 24648 and JP-A-62 24647.

Spitsyn et al., "Vapor Growth of Diamond on Diamond and Other Surfaces", 1981, 219–226.

Waltraud Werdecker & Fritz Aldinger, "Aluminum Nitride–An Alternative Ceramic Substrate for High Power Applications in Microcircuits", IEEE 1984, pp. 399–404.

Form A–14053, Effective Nov. 1987, The Carborundum Company, Standard Oil Engineered Materials–"High Thermal Conductivity Ceramics Comparison Product Data–Typical Values".

R.McPhillips, "Advanced Ceramic Materials from Thermal Conductivity Substrate Applications" Hybrid Circuit Technology, Aug. 1988.

"Elimination of Beryllium Oxide (BeO) from DoD Managed or Procured Electrical or Electronics Items", Defense Logistics Agency, Microwave Semiconductor Corp., Dec. 2, 1988.

Nobuo Setaka, "Vapor Deposition of Diamond", Nat'l Institute for Research in Inorganic Materials, Japan, pp. 1156–1163.

Lars–Peter Andersson, "A Review of Recent Work on Hard i–C Films", Thin Solid Films, 86 (1981) 193–200.

(List continued on next page.)

*Primary Examiner*—Frank Gonzalez
*Assistant Examiner*—Reginald A. Ratliff
*Attorney, Agent, or Firm*—Theodore E. Galanthay; Lisa K. Jorgenson

[57] ABSTRACT

An improved semiconductor package is provided wherein the mounting pad for the semiconductor is made from a material selected from the group consisting of aluminum nitride, diamond, alumina, and boron nitride.

2 Claims, 1 Drawing Sheet

OTHER PUBLICATIONS

R.C. DeVries, "Synthesis of Diamond Under Metastable Conditions", General Electric Corp. Research & Development, Ann. Rev. Maser. Sci. 1987, 17:161–87.

Anthony et al., "Thermal Diffusivity of Isotopically Enriched $^{12}C$ Diamond", Physical Review B, vol. 42, #2, 15 Jul., 1990–I, pp. 1104–1111.

Dyment et al., "Continuous Operation of GaAs Junction Lasers on Diamond Heat Sinks at 200° K.", Applied Physics Letter, vol. 11, #9, 1 Nov. 1967, pp. 292–294.

Morelli et al., "Thermal Conductivity of Synthetic Diamond Films", J. Appl. Phys. 64 (6), 15 Sep. 1988 pp. 3063–3066.

Angus, et al. "Low–Pressure, Metastable Growth of Diamond and 'Diamondlike' Phases", Science, vol. 241, pp. 913–921, Aug. 19, 1988.

Swan, "The Importance of Providing a Good Heat Sink for Avalanching Transit Time Oscillator Diodes", Proc. IEEE (Letters), vol. 55, p. 451, (1967).

Deshpandey et al., "Plasma Assisted Deposition Techniques and Synthesis of Novel Materials" Thin Solid Films, 163 (1988), pp. 131–147.

Williams et al., "Electron Microscopy of Vapor Phase Deposited Diamond", J. Mater. Res., vol. 5, #4, Apr. 1990, pp. 801–809.

Williams et al., "Characterization of Diamond Thin–Films: Diamond Phase Identification, Surface Morphology, and Defect Structures", J. Mater. Res., vol. 4, #2, Mar./Apr. 1989, pp. 373–383.

Landstrass et al., "Hydrogen Passivation of Electrically Active Defects in Diamond" Appl. Phys. Lett. 55(14), 2 Oct. 1969, pp. 1391–1393.

Zhu et al. "Structural Imperfections in CVD Diamond Films", J. Mater. Res., vol. 4, #3, May/Jun. 1989, pp. 659–663.

Setaka, "Diamond Synthesis from Vapor Phase and its Growth Process", J. Mater. Res. vol. 4, #3, May/Jun. 1989, pp. 664–670.

Landstrass et al. "Resistivity of Chemical Vapor Deposited Diamond Films", Appl. Phys. Lett 55(10), 4 Sep. 1989, pp. 975–976.

Balakov, "Diamond–Like Carbon Coatings: Problems and Achievements", Sov. J. Opt. Technol. 56(6), Jun. 1989, pp. 375–384.

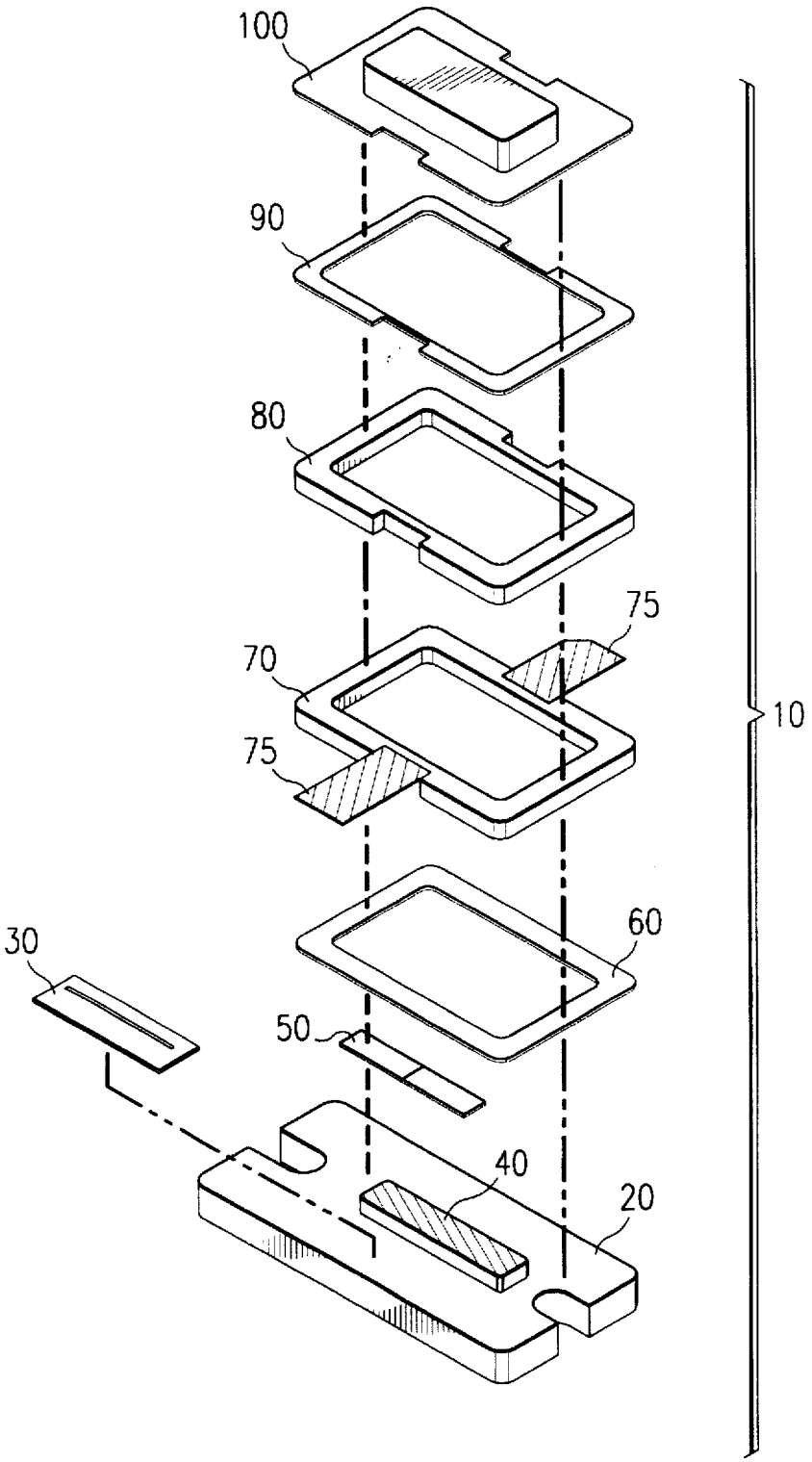
100
90
80
75
70
75
10
60
30
50
40
20

RF TRANSISTOR PACKAGE AND MOUNTING PAD

Matter enclosed in heavy brackets [ ] appears in the original patent but forms no part of this reissue specification; matter printed in italics indicates the additions made by reissue.

BACKGROUND OF THE INVENTION

1. Field of the Invention

This invention provides a novel mounting package for RF transistors including a novel thermally conductive electrically insulating mounting pad, and relates to the semiconductor packaging industry.

2. Description of Related Art

The use of semiconductor devices for RF (radio or high frequency) applications has increased dramatically as heat dissipation, size, dependability, and other characteristics have made them particularly suited for many applications. Semiconductor transistors are very small and very difficult to use; therefore, they are generally incorporated into packages. Radio frequency packages are used for holding semiconductor components, particularly transistors, and for providing readily available terminals for connection to other components.

In designing such packages, the tendency of semiconductors to generate heat must be considered. To this end, the semiconductor is frequently mounted on a thermally conductive pad to act as a heat sink and dissipate heat generated by the transistor. However, semiconductors are sensitive to electrical energy, and therefore the thermally conductive pad should also be electrically insulating. Hence, a thermally conducting, electrically insulating material is used for the mounting pad. Commonly, this material is beryllia (beryllium oxide—BeO), although alumina (aluminum oxide—$Al_2O_3$) has occasionally been used.

Beryllia (BeO) has better thermal conductivity than $Al_2O_3$, and is therefore more commonly used. However, care must be taken in handling and processing BeO. BeO is highly toxic. It can be hazardous to the human respiratory system when in powder form. Therefore, care must be exercised if the BeO pad is to be machined or ground. Proper equipment and safeguards are needed to insure that the BeO is handled safely and that improper contact with humans is not made.

Another disadvantage of the prior art packages is that when BeO is used, a "thin" pad of BeO is employed. This pad is attached to the heat sink through the use of a preform. The preform is generally made of gold and tin, or silver and copper. The preform is placed between the mounting pad and the heat sink and the structure is heated. This melts the preform and brazes the pad to the heat sink. This creates two interfaces: pad-to-preform, and preform-to-heat sink. These interfaces decrease the thermal conductivity of the connection. Further, BeO has a high thermal conductivity up to about 200° C. to 250° C., but its performance decrease with increasing temperature.

The BeO pad used is generally about 0.040" to 0.060" thick. Such thickness is required since the mechanical strength of BeO is low. If the pad is not sufficiently thick, the pad may crack or split during attachment, or later upon heating from use.

SUMMARY OF THE INVENTION

It has now been discovered that other thermally conductive, electrically insulating materials may be used as mounting pads for mounting transistors and other semiconductors in packages. These materials may be applied directly to the surface of the heat sink in very thin films, or mounted on the heat sink as thin slivers. This increases the thermal conductivity of the package and decreases the overall height of the finished transistor package.

The materials which are useful for the present invention are; boron nitride (BN), diamond, aluminum nitride (AlN), and aluminum oxide/($Al_2O_3$). The BN, AlN, and $Al_2O_3$ may be deposited by plasma deposition. The diamond thin coating may be deposited by vacuum deposition. Any of the above materials may alternatively be mounted on the heat sink by placing a preform between the heat sink and a sliver of the material and heating the combination to braze the two together. These films or slivers can be substantially thinner than the BeO pads of the prior art, since the materials possess higher mechanical strength. Further, the films are deposited directly on the heat sink, thus eliminating one material-to-material interface.

BRIEF DESCRIPTION OF THE DRAWING

The FIGURE is a three dimensional expanded view of a package of the present invention.

DESCRIPTION OF THE PREFERRED EMBODIMENT(S)

Referring now to the FIGURE, package 10 of the present invention includes heat sink 20 with capacitor 30. Heat sink 20 is preferably made from tungsten and copper (W+Cu) which have qualities desirable for a heat sink. Heat sink 20 acts as a support for package 10. Capacitor 30 is mounted directly on heat sink 20 and inside of the assembled package 10.

Mounting pad 40 is attached to heat sink 20. Semiconductor 50 is then attached to mounting pad 40. These attachments will be explained further presently. Preform 60 is placed on heat sink 20, around capacitor 30, pad 40 and semiconductor 50. Lamina 70 and 80 are then placed on preform 60. The lamina 70 and 80 act as spacers to allow proper connections to be made to semiconductor 50. Lamina 70 and 80 are co-fired with leads 75 (for connection to semiconductor 50 on the inside) already in place. A second preform 90 is placed on lamina 70 and 80, and lid 100 caps the entire package.

Lamina 70 and 80 are generally made from alumina and allow proper positioning of leads 75 with respect to semiconductor 50. Lid 100 is generally made from kovar, an iron-cobalt alloy. Preforms 60 and 90 are made from gold and tin, or copper and silver. This allows low temperature brazing.

Mounting pad 40 may be made from any of several different materials and may be a sliver of material or a very thin coated layer. Pad 40 may be made of boron nitride, diamond, aluminum nitride, or alumina. Pad 40 is attached to heat sink 20 in different ways depending on the form of the pad.

A pad 40 made from diamond may take two different forms: a single crystal substrate, or a thin film. A single crystal substrate would be from 3 to 4 mils (0.003"–0.004") thick. Such a single crystal substrate would be bonded to heat sink 20 through the use of a gold and tin, or copper and silver preform. The preform is placed between the sliver and heat sink 20. Heat is then applied and the sliver is brazed to the heat sink 20.

The preferred method of using diamond for pad 40 is through vacuum deposition of minute diamond particles onto heat sink 20. This eliminates one material-to-material interface, allowing greater thermal conductivity between the semiconductor and the heat sink, across pad 40. This also reduces the size of pad 40. As previously mentioned, a diamond sliver is usually 3 to 4 mils (0.003"–0.004") thick, but when vacuum deposited, the diamond layer is preferably 10μ (0.00039") and generally between 0.3 and 0.5 mils (0.0003"–0.0005") thick. Whether a diamond sliver or diamond coating is used, the diamond pad 40 is then preliminarily plated with an appropriate metal and then gold plated. Semiconductor 50 is then mounted on the gold plating by applying heat and pressure. The gold plating and silicon semiconductor combine to form a gold-silicon euctectic which holds semiconductor 50 in place.

If pad 40 is made from boron nitride, aluminium nitride or alumina, it may also be applied to heat sink 20 in two different forms: as a thin layer; or as a thin sliver. A sliver of any of these materials would be approximately 8–12 mils (0.008"–0.012") thick. Use of such a sliver would necessitate the use of a preform to braze the sliver (pad 40) to heat sink 20. These materials may also be applied by plasma deposition. [Such a deposition technique cannot be used with diamond since it involves heating the material until plasma forms. In the case of diamond, it is not likely that the cooling carbon would reform into a diamond lattice structure.]

Plasma deposition produces a layer of material about 7–8 mils (0.007"–0.008") thick. Plasma deposition requires no preform to secure the coating. Whichever form of boron nitride, aluminium nitride or alumina is used, it must be plated with layers of molybdenum, nickel and gold. Semiconductor 50 is then secured to the gold plating as described above.

Using the techniques described above, the overall thickness of the RF package can be decreased by one-third from about 0.120" to about 0.080". However, if necessary, a Kovar spacer may be included between heat sink 20 and lamina 70 to maintain an overall package thickness of 0.120".

The invention has been described as an RF transistor package and mounting pad in the best mode known to applicant, however, it will be apparent that the invention may be varied in many ways. Such variations are not to be regarded as a departure from the spirit and scope of the appended claims.

I claim:

1. A semiconductor package having an input, output and a common terminal for connection therewith of respective terminals of a semiconductor which comprises:

a support member;

a thermally conducting, electrically insulating pad deposited directly on said support member as a thin film without use of an intermediate material between said pad and said support member, said pad adapted to receive said semiconductor;

a semiconductor mounted on said pad; and a protective lid, said pad comprising [a material selected from the group consisting of plasma deposited aluminum nitride,] vacuum deposited diamond[, plasma deposited alumina, and plasma deposited boron nitride].

[2. The package of claim 1 wherein said material is plasma deposited boron nitride.]

[3. The package of claim 2 wherein said pad is between 7 and 8 mils thick.]

[4. The package of claim 1 wherein said material is plasma deposited aluminum nitride.]

[5. The package of claim 4 wherein said pad is between 7 and 8 mils thick.]

[6. The package of claim 1 wherein said material is vacuum deposited diamond.]

7. The package of claim [6] *1* wherein said pad is between 0.3 and 0.5 mils thick.

[8. The package of claim 1 wherein said material is plasma deposited alumina.]

[9. The package of claim 8 wherein said pad is between 7 and 8 mils thick.]

* * * * *